(12) United States Patent
Debbins et al.

(10) Patent No.: US 6,377,046 B1
(45) Date of Patent: Apr. 23, 2002

(54) SYSTEM AND METHOD FOR INTERACTIVE IMAGE CONTRAST CONTROL IN A MAGNETIC RESONANCE IMAGING SYSTEM

(75) Inventors: Josef P. Debbins; Roshy J. Francis, both of Waukesha, WI (US); Richard J. Prorok, San Ramon, CA (US); Lawrence E. Ploetz, Brookfield, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 150 days.

(21) Appl. No.: 09/590,334

(22) Filed: Jun. 8, 2000

Related U.S. Application Data

(63) Continuation-in-part of application No. 09/200,158, filed on Nov. 25, 1998, now Pat. No. 6,166,544.

(51) Int. Cl.[7] .................................................. G01V 3/00
(52) U.S. Cl. ........................................ 324/309; 324/314
(58) Field of Search .............................. 324/309, 314, 324/300, 306, 312, 307, 322

(56) References Cited

U.S. PATENT DOCUMENTS

| | | | |
|---|---|---|---|
| 4,707,797 A | 11/1987 | Briggs | 364/607 |
| 4,830,012 A | 5/1989 | Riederer | 128/653 |
| 4,952,877 A | 8/1990 | Stormont et al. | 324/312 |
| 5,345,176 A | 9/1994 | LeRoux et al. | 324/309 |
| 5,451,876 A | 9/1995 | Sandford et al. | 324/322 |
| 5,498,963 A | 3/1996 | Schneider et al. | 324/309 |
| 5,512,827 A | 4/1996 | Hardy et al. | 324/309 |
| 5,541,513 A | 7/1996 | Maier | 324/309 |
| 5,560,361 A | 10/1996 | Glusick | 128/653.2 |
| 5,584,293 A | 12/1996 | Darrow et al. | 128/653.2 |
| 5,606,258 A | 2/1997 | Hoenninger, III et al. | 324/309 |
| 5,657,757 A | 8/1997 | Hurd et al. | 128/653.2 |
| 5,711,300 A | 1/1998 | Schneider et al. | 128/653.2 |
| 5,749,834 A | 5/1998 | Hushek | 600/410 |
| 5,810,729 A | 9/1998 | Hushek et al. | 600/410 |
| 6,166,544 A | * 12/2000 | Debbins et al. | 324/309 |

FOREIGN PATENT DOCUMENTS

| | | |
|---|---|---|
| EP | 0 567 794 A2 | 11/1993 |
| WO | WO 91/00530 | 1/1991 |
| WO | WO 95/34242 | 12/1995 |

* cited by examiner

Primary Examiner—Louis Arana
(74) Attorney, Agent, or Firm—Foley & Lardner; Peter J. Vogel; Michael A. Della Penna (57) ABSTRACT

A magnetic resonance (MR) imaging system equipped with real-time imaging capability and method of interactively prescribing image contrast are disclosed herein. The MR imaging system includes a sequence controller for constructing MR imaging pulse sequences and a waveform memory for storing waveform segments. The MR imaging system allows an operator to interactively prescribe image contrast mechanism prior to and/or during real-time imaging. The use of image contrast waveform segments, only as needed, minimizes unnecessary MR scan time.

55 Claims, 4 Drawing Sheets

SYSTEM AND METHOD FOR INTERACTIVE IMAGE CONTRAST CONTROL IN A MAGNETIC RESONANCE IMAGING SYSTEM

CROSS REFERENCE TO RELATED APPLICATIONS

The patent application is a continuation-in-part of U.S. Pat. application Ser. No. 09/200,158 by Debbins, et al., entitled "MR imaging System with Interactive Image Contrast Control", filed Nov. 25, 1998 now U.S. Pat. No. 6,166,544.

BACKGROUND OF THE INVENTION

The present invention relates generally to magnetic resonance (MR) imaging systems. More particularly, the present invention relates to an MR imaging system equipped for real-time imaging and which allows interactive modification of the image contrast of MR images produced therein.

When an object of interest, such as human tissue, is subjected to an uniform magnetic field (polarizing field Bo along the z direction in a Cartesian coordinate system denoted as x, y, and z), the individual magnetic moments of the spins in the tissue attempt to align with this polarizing field, but process about it in random order at their characteristic Larmor frequency. If the object, or tissue, is subjected to a magnetic field (excitation field $B_1$) which is the x-y plane and which is near the Larmor frequency, the net aligned moment, $M_2$, may be rotated, or "tipped" at a certain tipping angle, into the x-y plane to produce a net transverse magnetic moment $M_1$. A signal is emitted by the excited spins after the excitation signal $B_1$ is terminated and this signal may be received and processed to form an MR image.

When utilizing these signals to produce MR images, magnetic field gradients ($G_x$, $G_y$ and $G_z$) are also employed. Typically, the object to be imaged is scanned by a sequence of measurement cycles in which these gradient waveforms vary according to the particular localization method being used. The resulting set of received NMR signals (also referred to as MR signals) are digitized and processed to reconstruct the image using one of many well known reconstruction techniques.

When viewing an MR image of a structure of interest, such as an anatomical section, the MR imaging system operator may desire to view an MR image in which one or more types of tissue comprising the anatomical section is contrasted with respect to the remaining types of tissue comprising that anatomical section. Moreover, the operator may desire to modify the image contrast of an MR image acquisition in progress or to prescribe the image contrast prior to an MR image acquisition.

Each MR pulse sequence responsible for an MR image is comprised of at least one set of (regular) waveform segments—the imaging waveform segments. In addition, the MR pulse sequence includes certain features or architecture to provide image contrast in the MR image: (1) image contrast mechanisms can be inherent in the imaging waveform segments; (2) one or more parameters associated with the MR pulse sequence can be modified and/or specified by the operator, thereby affecting image contrast; or (3) one or more sets of image contrast waveform segments can be included along with the imaging waveform segments to comprise the MR pulse sequence. In this last case where image contrast waveform segments are utilized, such image contrast mechanisms are made possible by a corresponding magnetization preparation applied to the anatomical section prior to the application of the imaging waveform segments. Briefly, magnetization preparation involves preparing the spin state in the bore such that the anatomical section to be imaged is in a certain magnetized state immediately before the regular image scanning commences.

In conventional MR imaging systems, every MR pulse sequence responsible for a specific image contrast is typically constructed and stored in the MR imaging system prior to scanning. For example, an MR pulse sequence may comprise a specific image contrast waveform segment permanently linked to an imaging waveform segment. Then when the operator desires this specific image contrast, this all-inclusive pulse sequence is evoked and executed in its entirety. In another example, the MR pulse sequence may be constructed prior to scanning from a specific selection of short (or more basic components comprising the) waveform segments.

The drawback to these types of pulse sequence architectures is that the operator must wait until the image acquisition in progress is completed before newly desired image contrast mechanism(s) can be evoked. Moreover, even if the amplitudes, periods, or other parameters relating to a portion of die MR pulse sequence (e.g., the image contrast waveform segment) can be modified while the image acquisition is in progress (e.g., amplitude is set to zero), there is only negligible reduction in acquisition time because the modified portion of the pulse sequence must still be executed along with the rest of the pulse sequence.

Thus, there is a need for an MR imaging system capable of providing interactively prescribable image contrast mechanisms in real-time. There is a further need for an MR imaging system capable of modifying image contrast mechanisms in MR pulse sequences, as desired, through dynamic construction of MR pulse sequences of run-time.

BRIEF SUMMARY OF THE INVENTION

One embodiment of the invention relates to a method for interactively prescribing an image contrast of a magnetic resonance (MR) image produced in a magnetic resonance (MR) imaging system. The method includes storing a plurality of waveform segments in a waveform memory. Each of the waveform segments is associated with a distinct memory address and at least one of the waveform segment includes an image contrast mechanism. The method further includes selecting from the plurality of waveform segments stored in the waveform memory, and constructing an MR pulse sequence in real-time by dynamically connecting selected waveform segments at run-time. The method further includes acquiring MR data in real-time by execution of the MR pulse sequence to generate a current MR image that includes a desired image contrast.

Another embodiment of die invention relates to an interactive magnetic resonance (MR) imaging system. The system includes means for storing a plurality of waveform segments, and means for selecting from the plurality of waveform segments. Each of the waveform segments is associated with a distinct memory address and at least one of the waveform segment includes an image contrast mechanism. The system further includes means for constructing an MR pulse sequence in real-time by dynamically connecting selected waveform segments at run-time. The system further includes means for acquiring MR data in real-time by execution of the MR pulse sequence to generate a current MR image that includes a desired image contrast.

Another embodiment of the invention relates to an interactive magnetic resonance (MR) imaging system. The system includes a memory configured to store a plurality of waveform segments. Each of the waveform segments is associated with a distinct memory address and at least one of the waveform segment includes an image contrast mechanism. The system further includes an operator interface configured to permit an operator to select from the plurality of waveform segments, and a sequence controller coupled to the memory and configured to dynamically connect the selected waveform segments at run-time to construct a MR pulse sequence. The system further includes a MR imaging device coupled to the operator interface, memory, and sequence controller and configured to acquire MR data in real-time and generate a current MR image that includes a desired image contrast.

BRIEF DESCRIPTION OF THE DRAWINGS

The preferred embodiment will become more fully understood from the following detailed description, taken in conjunction with the accompanying drawings, wherein like reference numerals refer to like parts, in which.

DETAILED DESCRIPTION OF THE INVENTION

Figure 1:
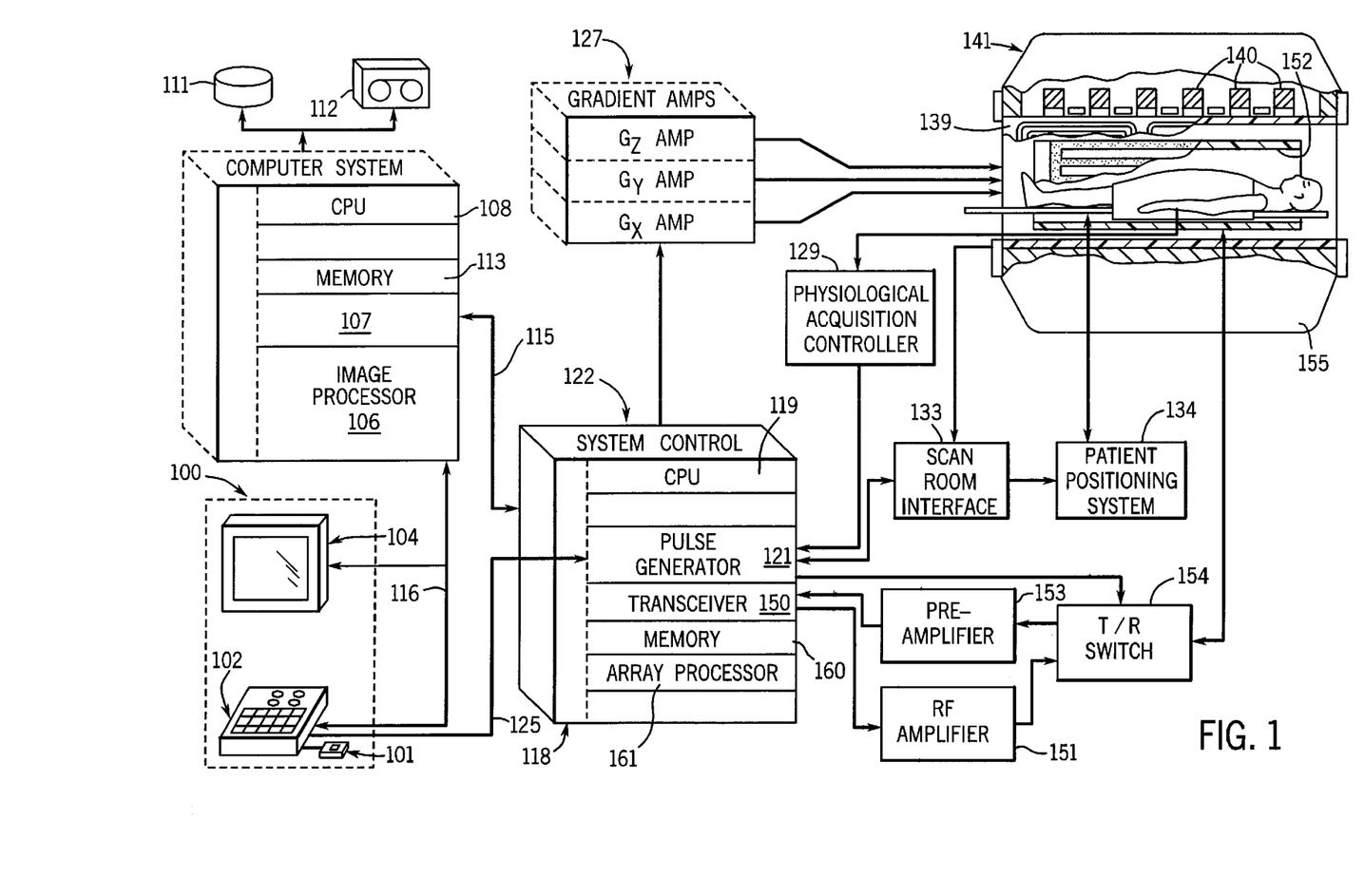
FIG. 1 is a block diagram of an MR imaging system which employs an embodiment of the present invention.

Referring first to FIG. 1, there is shown the major components of a magnetic resonance (MR) imaging system which includes an embodiment of the present invention. The operation of the system is controlled from an operator console 100 which includes an input device 101, a control panel 102, and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

The gradient waveform produced by the pulse generator module 121 are also applied to a transceiver module 150 in system control 122. The transceiver module 150 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals, also referred to as MR signals, picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
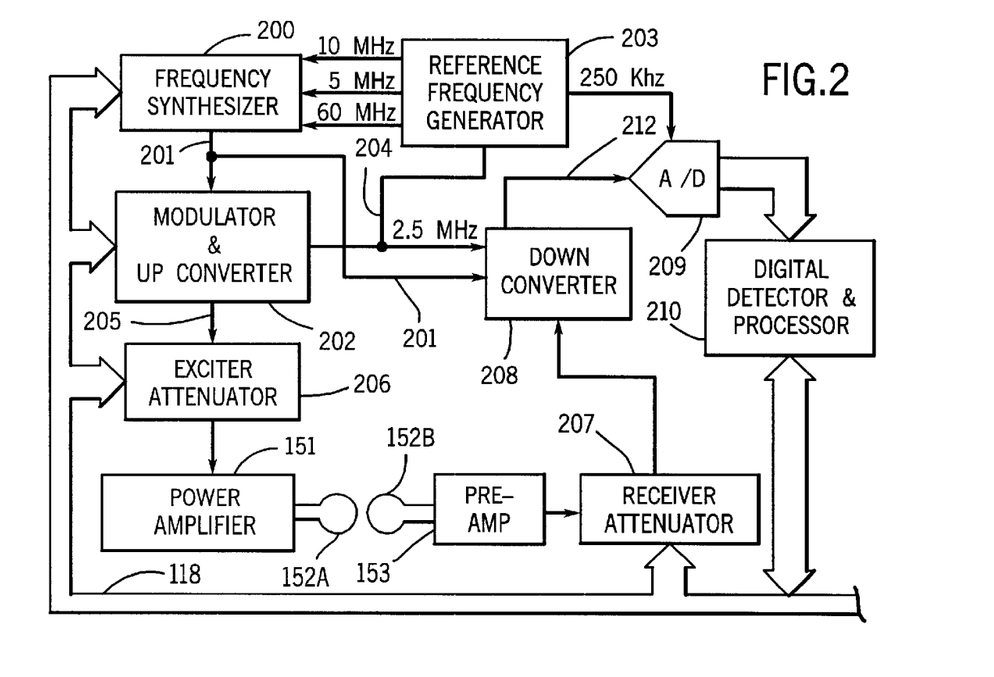
FIG. 2 is an electrical block diagram of a transceiver which comprises a part of the MR imaging system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as 15 shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 owned by the General Electric Company, which is incorporated herein by reference.

Referring still to FIGS. 1 and 2, the MR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

In one embodiment of the present invention, an operator interactively controls the image contrast of an MR image prior to or during its acquisition. Such interactive image contrast control is accomplished from the operator console 100 (also referred to as the operator interface) using the input device 101. The input device 101 is selected from a group including, but not limited to, a mouse, a joystick, a keyboard, a trackball, a touch screen, a light wand, and a voice control. One embodiment of the MR imaging system is capable of imaging in any desired orientation within the structure of interest and is equipped to perform both real-time acquisitions and non real-time acquisitions. In particular, real-time refers to continuous acquisition and reconstruction of MR image data as rapidly as it is acquired and displayed in approximately one second or less, as constrained by system performance.

Figure 3:
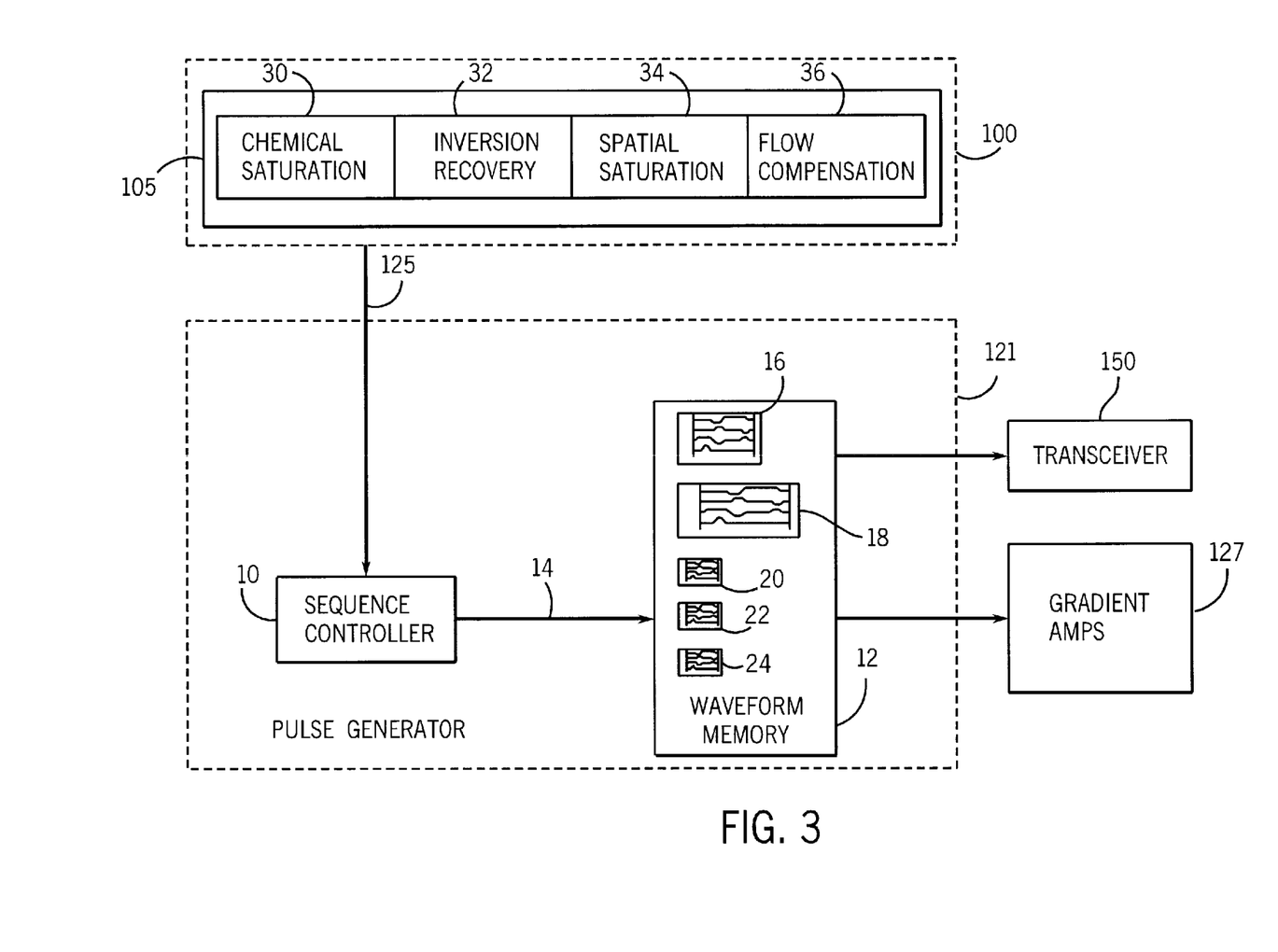
FIG. 3 is a more detailed block diagram of a pulse generator which comprises a part of the MR imaging system of FIG. 1.

FIG. 3 shows the major components of the pulse generator module used in an embodiment of the MR imaging system. Pulse generator module 121 includes a sequence controller 10 which connects to a waveform memory 12 through a communication link 14. A graphical user interface 105 and MR images of the structure of interest (not shown in FIG. 3) are displayed on the display 104 of the MR imaging system. The operator interacts with the graphical user interface 105 using the input device 101. The graphical user interface 105 includes a chemical saturation icon 30, a inversion recovery icon 32, a spatial saturation icon 34, and a flow compensation icon 36. The link 125 connecting the operator console 100 to the pulse generator module 121 communicates image contrast controls from the operator console 100 to the sequence controller 10.

Waveform memory 12 stores multiple sets of RF and gradient waveform segments, each set corresponding to a distinct imaging mechanism or image contrast mechanism. Each set of RF and gradient waveform segments is assigned a distinct memory address in waveform memory 12 such that any set of RF and gradient waveform segments is accessible from waveform memory 12. In the preferred embodiment, imaging waveform segments, corresponding to imaging mechanisms, include a set of base imaging waveform segment 16 and a set of flow compensation imaging waveform segment 18. Image contrast waveform segments, corresponding to image contrast mechanisms, include a set of chemical saturation waveform segment 20, a set of inversion recovery waveform segment 22, and a set of spatial saturation waveform segment 24. It should be understood that the waveforms depicted in the figures are for illustration purposes only and do not represent the actual waveforms in waveform memory 12.

Although not shown in FIG. 3, image contrast mechanisms available in the MR imaging system, and correspondingly, sets of waveform segments stored in waveform memory 12, can also include, but are not limited to, one or more of: RF spoiling, inversion recovery, spectrally selective inversion recovery, fluid attenuated inversion recovery, driven equilibrium, fat saturation, water saturation, magnetization transfer, diffusion weighting, inversion tagging, fat/water in-phase or out-of-phase, spatial saturation, T1 preparation, T2 preparation, variable TE, variable TR, variable receiver bandwidth, variable flip angle, variable spatial resolution, field of view, slice thickness, slice spacing, multiple slices, multiple passes, no-phase-wrap, asymmetric field of view, fractional Ky (legacy-fractional matrix sampling), fractional Kx (legacy-fractional echo), velocity encoding, respiratory compensation, cardiac compensation, multiple repetitions (legacy-multi-phase), and phase contrast.

Preferably, image contrast mechanisms are provided by the image contrast waveform segments, in which each set of image contrast waveform segment is a type of magnetization preparation that would be applied to the subject of interest prior to the application of the imaging waveform segments (e.g., the regular pulse sequence needed to acquire an MR image). However, image contrast mechanisms also be inherent and/or be generated within the imaging waveforn segments. For example, parameters associated with the imaging waveform segments can be modified and/or specified to affect image contrast of the MR image to be acquired. An embodiment of the MR imaging system provides the operator with the ability to modify and/or specify certain parameters (e.g., periods, timing, amplitudes, phases, etc.) associated with imaging waveform segments and/or image contrast waveform segments to further affect image contract.

It should be understood that the distinction or categorization of imaging waveform segments and image contrast waveform segments are for descriptive purposes only, and the division between the two may be less well defined.

In detail, the preferred embodiment of the present invention uses real-time MR imaging. To interactively prescribe the image contrast in real-time, the operator selects the desired image contrast mechanism by "clicking" on icon 30, 32, or 34 on the graphical user interface 105 (for example, icon 30 for chemical saturation). The operator also selects one imaging mechanism. In the preferred embodiment, the operator selects the flow compensation mechanism by clicking on the flow compensation icon 36, or the base imaging mechanism by not clicking on any imaging waveform segment icons. Thus, the base imaging waveform segment, corresponding to the base imaging mechanism, is the default imaging mechanism.

Figure 4:
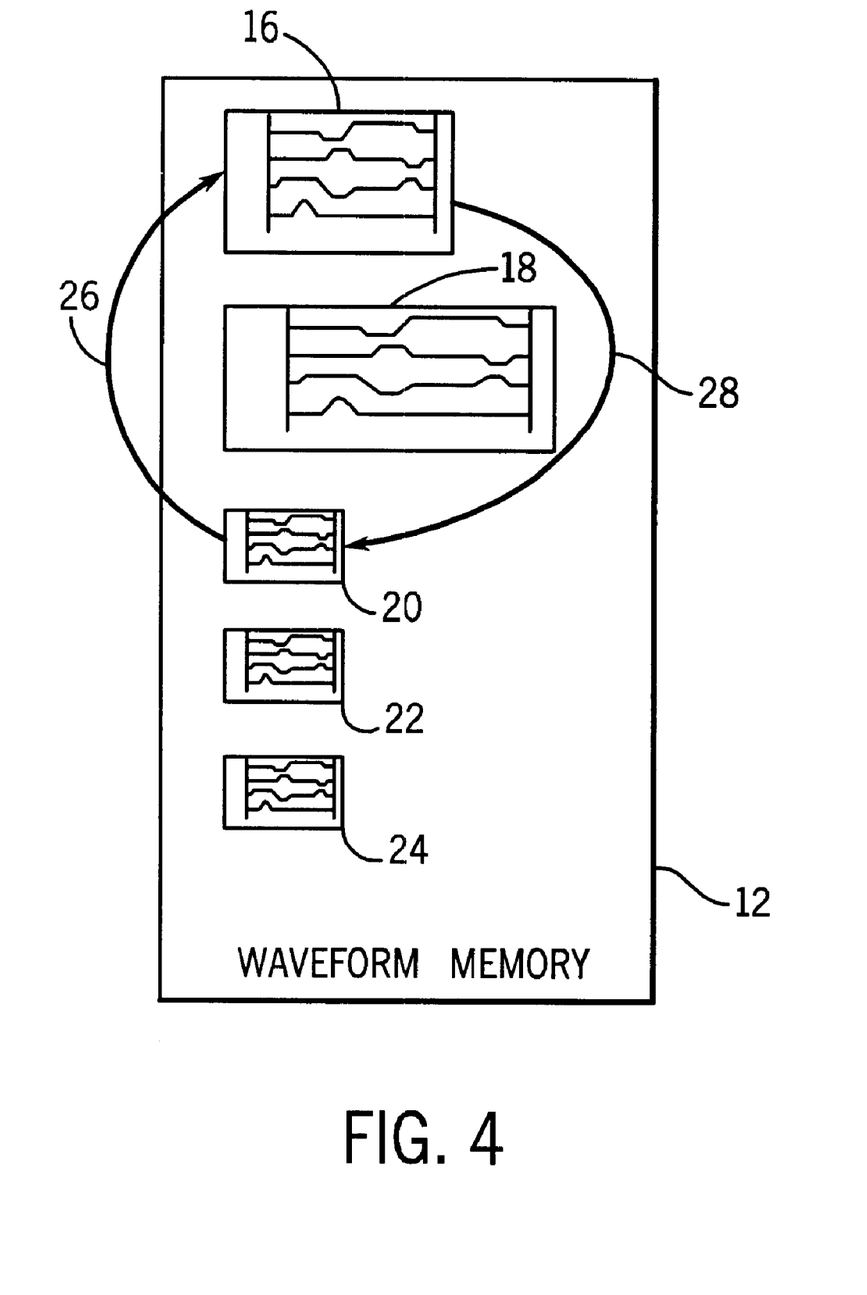
FIG. 4 is a block diagram of a waveform memory which comprises a part of the MR imaging system of FIG. 1.

Sequence controller 10 receives the operator's selection(s) via link 125 from the operator console 100. The sequence controller 10 first accesses the image contrast waveform segment corresponding to the selected image contrast mechanism (continuing the example, chemical saturation waveform segment 20). Second, the sequence controller 10 accesses the selected imaging waveform segment (continuing the example, base imaging waveform segment 16) almost instantaneously in time, to dynamically link or connect 26 selected image contrast waveform segment to the selected imaging waveform segment at run-time, as shown in FIG. 4. In this manner, a dynamically linked MR pulse sequence, comprised of the selected image contrast waveform segments followed by the selected imaging waveform segment, is constructed as need during execution. Then the sequence controller 10 applies this dynamically linked MR pulse sequence to the gradient amplifier system 127 and transceiver 150 to be executed or "played out" such that MR data can be acquired.

Next, the sequence controller 10 accesses the selected image contrast waveform segment (continuing the example, chemical saturation waveform segment) again, almost instantaneously in time, to construct the next dynamically linked 28 MR pulse sequence. Access and execution of the selected image contrast waveform segment and the selected imaging waveform segment occurs repeatedly in this cyclic manner with appropriate modifications to the MR pulse sequence at each cycle or repetition to acquire enough MR data in accordance with the resolution of the proposed MR image to be displayed. For example, an MR image with 256 phase encoding views would require the MR pulse sequence to be executed 256 times in standard spin-warp MR imaging. The final result, after acquisition and reconstruction in real-time, is an MR image with the desired image contrast (in this example, chemical saturation, which suppresses the relatively large magnetization signal from fatty tissue).

Thus, each MR pulse sequence to be executed is not stored in its entirety in a memory or buffer. Instead, a given MR pulse sequence is generated or constructed (for only a moment in time) in the sense that real-time or quasi-real-time sequential access of appropriate waveform segment addresses, and correspondingly, the waveform segments, in waveform memory 12 creates a dynamically connected pulse sequence sufficiently long enough for it to be "played out".

It is contemplated that the waveform segments may be stored in more than one waveform memory. It is also contemplated that more than one sequence controller may be included in the MR imaging system of FIG. 1. Utilizing more than one waveform memory and/or sequence controller can facilitate even shorter scan times. Accessing multiple waveform memories (to fulfill different waveform segment access needs), or conjunctive or alternating sequencing from multiple sequence controllers may be implemented in alternative embodiments of the present invention.

In the preferred embodiment, the selected image contrast waveform segment comprises the first portion of the dynamically constructed MR pulse sequence. Moreover, the operator has the option of selecting more than one image contrast mechanism for a proposed MR image or not selecting any image contrast mechanisms for a proposed MR image. In the first case of selecting more than one image contrast mechanism for a proposed MR image, the dynamically linked MR pulse sequence would contain all the selected image contrast waveform segments first followed by the imaging waveform segment. The order of the image contrast waveform segments is determined by predetermined order or some appropriate algorithm already prescribed in the MR imaging system. In the second case of not selecting any imaging contrast mechanism for a proposed MR image, the dynamically linked MR pulse sequence would only contain the selected imaging waveform segment. Hence, the advantage of independently invoking waveform segments to construct the MR pulse sequence, as needed at run-time, becomes apparent in real-time imaging where minimal scan time is of the essence.

To further interactively prescribe the image contrast in real-time, the operator can select the desired image contrast and/or imaging mechanisms prior to initiating a scan or the operator can select the desired image contrast and/or imaging mechanisms while a scan is in progress. When the operator selects the desired image contrast and/or imaging mechanisms while a scan is in progress, the MR imaging system can instantaneously (e.g., in less than 100 milliseconds) replace the current sets of waveform segments with new sets of waveform segments (i.e., dynamically construct a new MR pulse sequence) corresponding to the newly mechanisms. Although not shown in the figures, the graphical user interface 105 can additionally include icons for the operator to prescribe how the MR imaging system should deal with the scan in progress. Alternatively, the MR imaging system can include preset rules which dictate what should be done to the scan in progress.

For example, the MR imaging system can halt the current scan and/or halt the current MR image from being displayed; instead the sequence controller 10 can immediately initiate a new scan with the newly selected waveform segments and consequently display the latest MR image being desired. Alternatively, the MR imaging system can complete the current scan in progress and display the current MR image acquired; then the sequence controller 10 can initiate a new scan with the newly selected waveform segments. In still another alternative, the newly selected waveform segments can be used to finish the current scan in progress such that the resulting MR image is a conglomeration or hybrid of the current scan that was in progress with the current waveform segments and the new scan (comprising the remainder of the "current scan") with the newly selected waveform segments.

To still further interactively prescribe the image contrast in real-time, the operator can directly modify the image contrast in real-time. Although not shown in the figures, the graphical user interface can include icons configured to allow the operator to directly modify individual gradient and RF amplitudes, pulse widths, and/or relative timing within each waveform segment. The direct modification can be accomplished graphically (e.g., slide bar icons) or explicitly (e.g., specific numerical values). Thus, in this manner, the present invention provides interactive and acquisition time saving image contrast controls to the operator.

While die embodiments and application of the invention illustrated in the figures and described above are presently preferred, it should be understood that these embodiments are offered by way of example only. For example, it is contemplated that the invention may be applied to systems other than medical systems which can benefit from the use of interactive image contrast control. In still another example, a second sequence controller and/or a second waveform memory can be utilized to dynamically construct the next MR pulse sequence. The next MR pulse sequence could be associated with the next MR image to be acquired after the current acquisition has been completed. Alternatively, the next MR pulse sequence could be the instantaneous replacement of the current MR pulse sequence because the operator prescribed a different image contrast while the current acquisition was in progress. Accordingly, the invention is not limited to a particular embodiment, but extends to alternatives, modifications, and variations that nevertheless fall within the spirit and scope of the appended claims.

What is claimed is:

1. A method for interactively prescribing an image contrast of a magnetic resonance (MR) image produced in a magnetic resonance (MR) imaging system, comprising:

(a) storing a plurality of waveform segments in a waveform memory, wherein each of the waveform segments is associated with a distinct memory address and at least one of the waveform segment includes an image contrast mechanism;

(b) selecting from the plurality of waveform segments stored in the waveform memory;

(c) constructing an MR pulse sequence in real-time by dynamically connecting selected waveform segments at run-time; and (d) acquiring MR data in real-time by execution of the MR pulse sequence to generate a current MR image that includes a desired image contrast.

2. The method of claim 1, wherein each of the waveform segments is comprised of at least one of a radio frequency (RF) waveform segment and a gradient waveform segment.

3. The method of claim 1, wherein the storing step includes storing at least one imaging waveform segment and at least one image contrast waveform segment.

4. The method of claim 3, further comprising (e) reconstructing the MR data to generate the current MR image in real-time and (f) displaying the current MR image.

5. The method of claim 4, further comprising repeating steps (d)–(e) a plurality of times with appropriate modifications to the MR pulse sequence at each repetition to acquire enough MR data in accordance with a resolution of the current MR image.

6. The method of claim 4, further comprising (g) subsequently selecting from the plurality of waveform segments stored in the waveform memory while any of steps (c)–(g) is in progress to prescribe a new image contrast.

7. The method of claim 6, further comprising halting any of steps (c)–(f) in progress when the subsequently selecting step (g) occurs.

8. The method of claim 7, further comprising constructing a new MR pulse sequence in real-time by dynamically connecting the subsequently selected waveform segments, as specified in the subsequently selecting step (g), and executing the new MR pulse sequence in real-time to generate a new MR image that includes the new image contrast.

9. The method of claim 8, wherein constructing a new MR pulse sequence includes instantaneously accessing the subsequently selected waveform segments in place of the selected waveform segments when the constructing step (c) in progress and then the subsequently selecting step (g) occurs.

10. The method of claim 6, wherein steps (c)–(f) are completed before constructing a new MR pulse sequence in real-time by dynamically connecting the subsequently selected waveform segments and executing the new MR pulse sequence in real-time to generate a new MR image that includes the new image contrast.

11. The method of claim 6, wherein immediately upon occurrence of the subsequently selecting step (g) while the constructing step (c) is in progress, the remainder of the constructing step (c) is completed by constructing a hybrid MR pulse sequence in real-time instead of the MR pulse sequence, wherein the hybrid MR pulse sequence includes at least some of the selected waveform segments and at least some of the subsequently selected waveform segments dynamically connected together.

12. The method of claim 11, wherein the hybrid MR pulse sequence is utilized in steps (d)–(f) to generate a hybrid MR image that includes at least some of the new image contrast.

13. The method of claim 3, wherein the storing step includes storing at least one image contrast waveform segment that is a magnetization preparation mechanism.

14. The method of claim 3, wherein the at least one image contrast waveform segment is selected from a group including an inversion recovery segment, a chemical saturation waveform segment, and a spatial saturation waveform segment.

15. The method of claim 3, wherein the at least one imaging waveform segment is a flow compensation waveform segment.

16. The method of claim 3, wherein the MR pulse sequence comprises at least one imaging waveform segment.

17. The method of claim 3, wherein the selecting step includes selecting at least one image contrast waveform segment and one imaging waveform segment.

18. The method of claim 3, wherein the MR pulse sequence comprises a default base imaging waveform segment stored in the waveform memory when no explicit selection is made in the selecting step (b).

19. The method of claim 3, wherein selecting from the plurality of waveform segments includes selecting more than one image contrast waveform segments.

20. The method of claim 3, wherein constructing the MR pulse sequence includes a sequence controller sequentially accessing at run-time the selected image contrast waveform segments in the waveform memory and the selected imaging waveform segment in the waveform memory.

21. The method of claim 20, wherein constructing the MR pulse sequence includes dynamically connecting the selected imaging waveform segment after the end of the selected image contrast waveform segments.

22. The method of claim 1, further comprising modifying the MR pulse sequence from a modification step selected from a group including modifying an individual gradient amplitude associated with the MR pulse sequence, modifying a radio frequency (RF) amplitude associated with the MR pulse sequence, modifying a pulse width associated with the MR pulse sequence, and modifying a relative timing within the MR pulse sequence.

23. An interactive magnetic resonance (MR) imaging system, comprising:

(a) means for storing a plurality of waveform segments, wherein each of the waveform segments is associated with a distinct memory address and at least one of the waveform segment includes an image contrast mechanism;

(b) means for selecting from the plurality of waveform segments;

(c) means for constructing an MR pulse sequence in real-time by dynamically connecting selected waveform segments at run-time; and (d) means for acquiring MR data in real-time by execution of the MR pulse sequence to generate a current MR image that includes a desired image contrast.

24. The system of claim 23, wherein each of the waveform segments is comprised of at least one of a radio frequency (RF) waveform segment and a gradient waveform segment.

25. The system of claim 23, wherein the means for storing includes at least one imaging waveform segment and at least one image contrast waveform segment.

26. The system of claim 25, further comprising (e) means for reconstructing the MR data to generate the current MR image in real-time and (f) means for displaying the current MR image.

27. The system of claim 26, further comprising (g) means for subsequently selecting from the plurality of waveform segments while scanning of the current MR image is in progress.

28. The system of claim 27, further comprising means for halting any of the means for constructing, the means of acquiring, the means for reconstructing, and the means for displaying when the means for subsequently selecting is activated.

29. The system of claim 28, further comprising means for constructing a new MR pulse sequence in real-time by dynamically connecting the subsequently selected waveform segments, as specified in the means for subsequently selecting, and means for executing the new MR pulse sequence in real-time to generate a new MR image that includes the new image contrast.

30. The system of claim 29, wherein the means for constructing a new MR pulse sequence is configured to instantaneously access the subsequently selected waveform segments in place of the selected waveform segments, when the MR pulse sequence is being constructed and the subsequently selected waveform segments exist.

31. The system of claim 25, wherein the means for storing includes at least one image contrast waveform segment that is a magnetization preparation mechanism.

32. The system of claim 25, wherein the at least one image contrast waveform segment is selected from a group including an inversion recovery waveform segment, a chemical saturation waveform segment, and a spatial saturation waveform segment.

33. The system of claim 25, wherein the at least one imaging waveform segment is a flow compensation waveform segment.

34. The system of claim 25, wherein the MR pulse sequence comprises at least one imaging waveform segment.

35. The system of claim 25, wherein the MR pulse sequence includes at least one image contrast waveform segment and one imaging waveform segment.

36. The system of claim 25, wherein the MR pulse sequence comprises a default base imaging waveform segment stored in the means for storing when no explicit selection is made by an operator.

37. The system of claim 25, wherein means for selecting from the plurality of waveform segments is configured to permit selecting more than one image contrast waveform segments to construct the MR pulse sequence.

38. The system of claim 25, wherein the means for constructing the MR pulse sequence includes a sequence controller configured to sequentially access at run-time the selected image contrast waveform segments in the means for storing and the selected imaging waveform segment in the means for storing.

39. The system of claim 38, wherein the means for constructing the MR pulse sequence is configured to dynamically connect the selected imaging waveform segment after the end of the selected image contrast waveform segments.

40. The system of claim 23, further comprising means for modifying the MR pulse sequence selected from a group including modifying an individual gradient amplitude associated with the MR pulse sequence, modifying a radio frequency (RF) amplitude associated with the MR pulse sequence, modifying a pulse width associated with the MR pulse sequence, and modifying a relative timing within the MR pulse sequence.

41. The system of claim 23, wherein the means for constructing comprises at least two sequence controllers and the means for storing comprises at least two waveform memories.

42. An interactive magnetic resonance (MR) imaging system, comprising:
a memory configured to store a plurality of waveform segments, wherein each of the waveform segments is associated with a distinct memory address and at least one of the waveform segment includes an image contrast mechanism;
an operator interface configured to permit an operator to select from the plurality of waveform segments;
a sequence controller coupled to the memory and configured to dynamically connect the selected waveform segments at run-time to construct a MR pulse sequence; and
an MR imaging device coupled to the operator interface, memory, and sequence controller and configured to acquire MR data in real-time and generate a current MR image that includes a desired image contrast.

43. The system of claim 42, wherein the operator interface includes an input device selected from a group including a mouse, a joystick, a keyboard, a trackball, a touch screen, a light wand, and a voice control.

44. The system of claim 43, wherein the operator interface includes a plurality of icons on a display means for displaying the available waveform segments.

45. The system of claim 42, wherein the MR imaging device is further configured to reconstruct the MR data to generate the current MR image in real-time and display the current MR image.

46. The system of claim 45, wherein the waveform segments comprise at least one image contrast waveform segment that is a magnetization preparation mechanism.

47. The system of claim 45, wherein the at least one image contrast waveform segment is selected from a group including an inversion recovery waveform segment, a chemical saturation waveform segment, and a spatial saturation waveform segment.

48. The system of claim 45, wherein the at least one imaging waveform segment is a flow compensation waveform segment.

49. The system of claim 45, wherein the MR pulse sequence includes at least one imaging waveform segment.

50. The system of claim 45, wherein the MR pulse sequence comprises a default base imaging waveform segment stored in the memory when no explicit selection is made by an operator.

51. The system of claim 45, wherein the sequence controller is configured to dynamically connect the selected imaging waveform segment after the end of the selected image contrast waveform segments.

52. The system of claim 42, wherein the operator interface is configured to be responsive to subsequent selections of the waveform segments while scanning of the current MR image is in progress.

53. The system of claim 42, wherein the memory includes at least one imaging waveform segment and at least one image contrast waveform segment.

54. The system of claim 42, further comprising an another memory configured to store a portion of the plurality of waveform segments.

55. The system of claim 54, further comprising an another sequence controller to dynamically construct an another MR pulse sequence by appropriately accessing the memory and the another memory while acquisition of MR data relating to the current MR image is in progress.

* * * * *